(12) United States Patent
Li et al.

(10) Patent No.: US 11,149,878 B2
(45) Date of Patent: Oct. 19, 2021

(54) CABLE MANAGEMENT CAGE AND CHASSIS

(71) Applicant: WISTRON CORP., New Taipei (TW)

(72) Inventors: Ying Li, New Taipei (TW); Zhao-Ping Fu, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 16/879,130

(22) Filed: May 20, 2020

(65) Prior Publication Data

US 2021/0254759 A1  Aug. 19, 2021

(30) Foreign Application Priority Data

Feb. 19, 2020 (CN) .......................... 202010101685.4

(51) Int. Cl.
*F16L 3/26* (2006.01)
*F16L 3/10* (2006.01)
*F16L 3/23* (2006.01)
*H02G 3/04* (2006.01)

(52) U.S. Cl.
CPC ................. *F16L 3/26* (2013.01); *F16L 3/10* (2013.01); *F16L 3/23* (2013.01); *H02G 3/0456* (2013.01)

(58) Field of Classification Search
CPC ...... F16L 3/26; F16L 3/10; F16L 3/23; H02G 3/0456; H05K 5/069; H05K 5/0247; G02B 6/4447; G02B 6/4448; G02B 6/4446; G02B 6/445; H02B 1/202; H02B 1/26; H02B 1/305; A47B 88/407; A47B 88/423; A47B 2088/4235; A47B 2088/4276; A47B 88/433
See application file for complete search history.

(56) References Cited

U.S. PATENT DOCUMENTS

| | | | |
|---|---|---|---|
| 6,442,030 B1 * | 8/2002 | Mammoser | G06F 1/1601 248/917 |
| 6,601,933 B1 * | 8/2003 | Greenwald | H05K 7/1489 312/330.1 |
| 7,604,307 B2 * | 10/2009 | Greenwald | A47B 88/49 312/333 |
| 7,661,778 B2 * | 2/2010 | Yang | A47B 88/427 312/333 |
| 7,871,139 B2 * | 1/2011 | Yu | A47B 88/43 312/333 |
| 9,277,663 B2 | 3/2016 | George et al. | |

(Continued)

*Primary Examiner* — Christopher Garft
(74) *Attorney, Agent, or Firm* — McClure, Qualey & Rodack, LLP (57) ABSTRACT

The disclosure relates to a cable management cage including cage body and engagement and disengaging components. A fixed end of the elastic plate is fixed to an inner surface of the cage body, the elastic plate and the inner surface are spaced apart by a gap, the engaging structure is fixed on a free end of the elastic plate and movably disposed through a through hole of the cage body. The disengaging component is movably disposed on the cage body. When the disengaging component is in a non-disengaging status, the engaging structure protrudes from the outer surface of the cage body. When the disengaging component is in a disengaging status, part of the disengaging component enters the gap to cause the engaging structure to a position not protruding from the outer surface of the cage body.

18 Claims, 10 Drawing Sheets

(56) References Cited

U.S. PATENT DOCUMENTS

| | | | |
|---|---|---|---|
| 10,222,569 B1 | 3/2019 | Ehlen | |
| 2007/0018547 A1* | 1/2007 | Yang | A47B 88/427 |
| | | | 312/333 |
| 2009/0294621 A1* | 12/2009 | Yu | A47B 88/43 |
| | | | 248/429 |
| 2009/0310894 A1* | 12/2009 | Yu | A47B 88/44 |
| | | | 384/21 |
| 2011/0017894 A1* | 1/2011 | Yu | H05K 7/1489 |
| | | | 248/309.1 |
| 2011/0017895 A1* | 1/2011 | Yu | H05K 7/1489 |
| | | | 248/309.1 |
| 2012/0134082 A1* | 5/2012 | Li | H05K 5/0247 |
| | | | 361/679.01 |
| 2020/0362993 A1* | 11/2020 | Li | F16L 3/2235 |

* cited by examiner

CABLE MANAGEMENT CAGE AND CHASSIS

CROSS-REFERENCE TO RELATED APPLICATIONS

This non-provisional application claims priority under 35 U.S.C. § 119(a) on Patent Application No(s). 202010101685.4 filed in China on Feb. 19, 2020, the entire contents of which are hereby incorporated by reference.

TECHNICAL FIELD

The disclosure relates to a holder casing, more particularly to a cable management cage and a chassis.

BACKGROUND

Servers play a very important role in cloud services. A server can provide and implement various cloud services requested by users. In order to effectively and stably support massive computation and storage, the server is equipped with functional modules as much as possible in a limited space. In such a case, the component arrangement in the server becomes very compact, so the cables connected between these components are only be arranged along the sidewall of the server chassis.

In the conventional server chassis, at least part of the cables are collected in a bundle on a cable rack suspended on the sidewall of the server chassis, and the cable rack is detachable to facilitate the installation/removal of components located below the cable rack (e.g., mainboard or other electric components). Also, to prevent the cable rack from falling off from the sidewall of the server chassis, a conventional fixing arrangement for fixing the cable rack to the sidewall is to install a plunger pin operative by a wrench on the cable rack. In detail, the plunger pin is a retractable piece that can be moved by a wrench connected thereto. Operating the position of the wrench can cause part of the plunger pin to protrude from the cable rack and to insert into the sidewall of the server chassis and thus fixing the cable rack onto the sidewall.

However, the plunger pin and the wrench both occupy a large space in the cable rack and their operation require a certain amount of movable range, thus the conventional fixing arrangement usually affects the placement/removal of the cable from the cable rack, and the wrench is easily touched or moved to open position by the cable or human hand during the placement/removal of cable, resulting unexpected loosening of the cable rack.

SUMMARY

One embodiment of the disclosure provides a cable management cage including a cage body, an engagement component, and a disengaging component. The cage body has an inner surface, an outer surface opposite to the inner surface, and a through hole penetrating through the inner surface and the outer surface. The engagement component includes an elastic plate and an engaging structure. The elastic plate includes a fixed end and a free end opposite to each other. The fixed end of the elastic plate is fixed to the inner surface of the cage body, the elastic plate and the inner surface are spaced apart by a gap, and the engaging structure is fixed on the free end of the elastic plate and movably disposed through the through hole. The disengaging component is movably disposed on the cage body and have a disengaging status and a non-disengaging status. When the disengaging component is in the non-disengaging status, the engaging structure protrudes from the outer surface of the cage body. When the disengaging component is in the disengaging status, at least part of the disengaging component enters into the gap to cause the free end of the elastic plate to move away from the through hole so as to move the engaging structure to a position not protruding from the outer surface of the cage body.

Another embodiment of the disclosure provides a chassis including a chassis body, a cage body, an engagement component, and a disengaging component. The chassis body includes at least one sidewall. The at least one sidewall has a mount hole. The cage body has an inner surface, an outer surface opposite to the inner surface, and a through hole penetrating through the inner surface and the outer surface. The engagement component includes an elastic plate and an engaging structure. The elastic plate includes a fixed end and a free end opposite to each other. The fixed end of the elastic plate is fixed to the inner surface of the cage body, the elastic plate and the inner surface are spaced apart by a gap, and the engaging structure is fixed on the free end of the elastic plate and movably disposed through the through hole. The disengaging component is movably disposed on the cage body and have a disengaging status and a non-disengaging status. The cage body is detachably disposed on the at least one sidewall, the through hole of the cage body corresponds to the mount hole. When the disengaging component is in the non-disengaging status, the engaging structure protrudes from the outer surface of the cage body and located in the mount hole; when the disengaging component is in the disengaging status, the engaging structure does not protrude from the outer surface of the cage body and is detached from the mount hole.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details.

In addition, for the purpose of simple illustration, well-known features may be drawn schematically, and some unnecessary details may be omitted from the drawings. And the size or ratio of the features in the drawings of the present disclosure may be exaggerated for illustrative purposes, but the present disclosure is not limited thereto. Note that the actual size and designs of the product manufactured based on the teaching of the present disclosure may also be properly modified according to any actual requirement.

Further, as used herein, the terms "end", "part", "portion" or "area" may be used to describe a technical feature on or between component(s), but the technical feature is not limited by these terms. In addition, unless otherwise specified, the term "substantially", "approximately" or" about" may be used herein to provide an industry-accepted tolerance to its corresponding term without resulting in a change in the basic function of the subject matter at issue.

Furthermore, unless otherwise defined, all the terms used in the disclosure, including technical and scientific terms, have their ordinary meanings that can be understood by those skilled in the art. Moreover, the definitions of the above terms are to be interpreted as being consistent with the technical fields related to the disclosure. Unless specifically defined, these terms are not to be construed as too idealistic or formal meanings.

Figure 1:
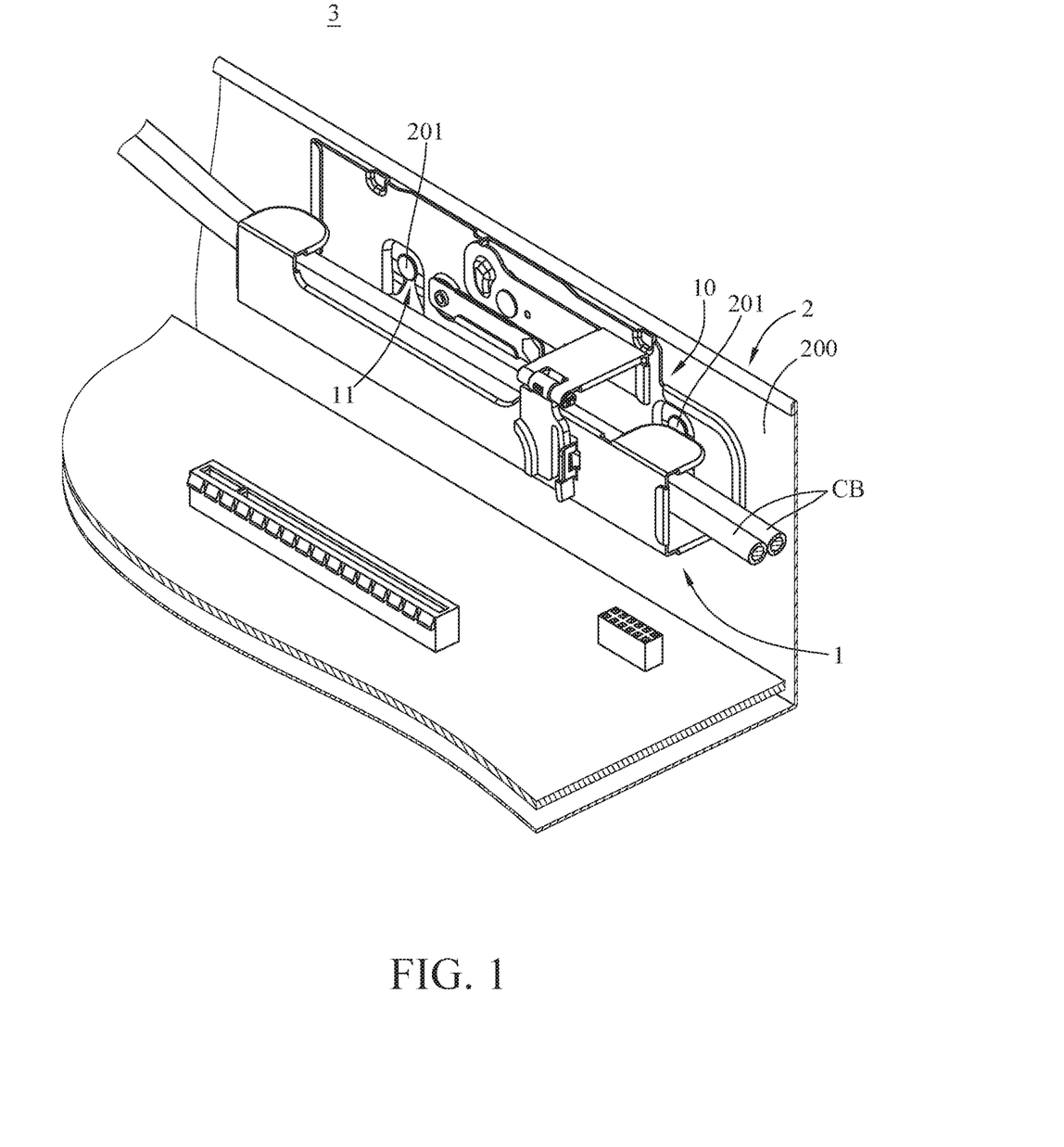
FIG. 1 is a partial enlarged perspective view of a chassis according to one embodiment of the disclosure.

Firstly, referring to FIG. 1, one embodiment of the disclosure provides a chassis 3, the chassis 3 may include at least one cable management cage 1 and a chassis body 2. The chassis 3 is, but not limited to, a server chassis or a chassis for other electronic devices, but the disclosure is not limited thereto. The chassis body 2 is configured to accommodate the cable management cage 1 and other electronic devices or components not necessary to the disclosure. Note that the chassis body 2 shown in the drawings is exemplary and merely for the purpose of reflecting the spirit of the disclosure, and the type or configuration of the chassis body 2 is not intended to limit the disclosure. And for the purpose of simple and clear illustration, FIG. 1 and subsequent figures may only show part of the chassis body 2. In addition, some unnecessary details, such as cables, circuit boards, screws, other casings, and electrical components, on the chassis body 2 may be partially shown in the drawings, be simplified or omitted from the drawings.

In this embodiment, the cable management cage 1 includes a cage body 10 detachably disposed on a sidewall 200 of the chassis body 2. The cable management cage 1 is configured to support and collectively store one or more cables CB in the chassis body 2. As shown, the cable management cage 1 is able to hold the cables CB in position and keep them organized and arranged along the sidewall 200. Note that the cables CB are merely for the purpose of reflecting the spirit of the disclosure, and the quantity and configuration of the cables CB are not intended to limit the disclosure.

In this embodiment, the cage body 10 may include at least one mounting structure 11, and the sidewall 200 of the chassis body 2 may include at least one mounting structure 201. As shown, the mounting structure 11 of the cage body 10 is, for example, a through hole, and the mounting structure 201 on the sidewall 200 of the chassis body 2 is, for example, an I-shaped rivet fixed on the sidewall 200 or a protrusion integrally formed on the sidewall 200, where the mounting structure 201 is configured to be slidably and removably disposed at the mounting structure 11 of the cage body 10. The cage body 10 is detachably disposed on the sidewall 200 via the cooperation of the mounting structure 11 and the mounting structure 201. As shown, the cable management cage 1 is suitable for being installed in a casing or chassis (e.g., the chassis body 2) having a relatively limited internal space, and the removal of the cable management cage 1 helps the process of removing other internal components of the chassis body 2, such as the mainboard (not numbered) underneath the cable management cage 1.

Figure 2:
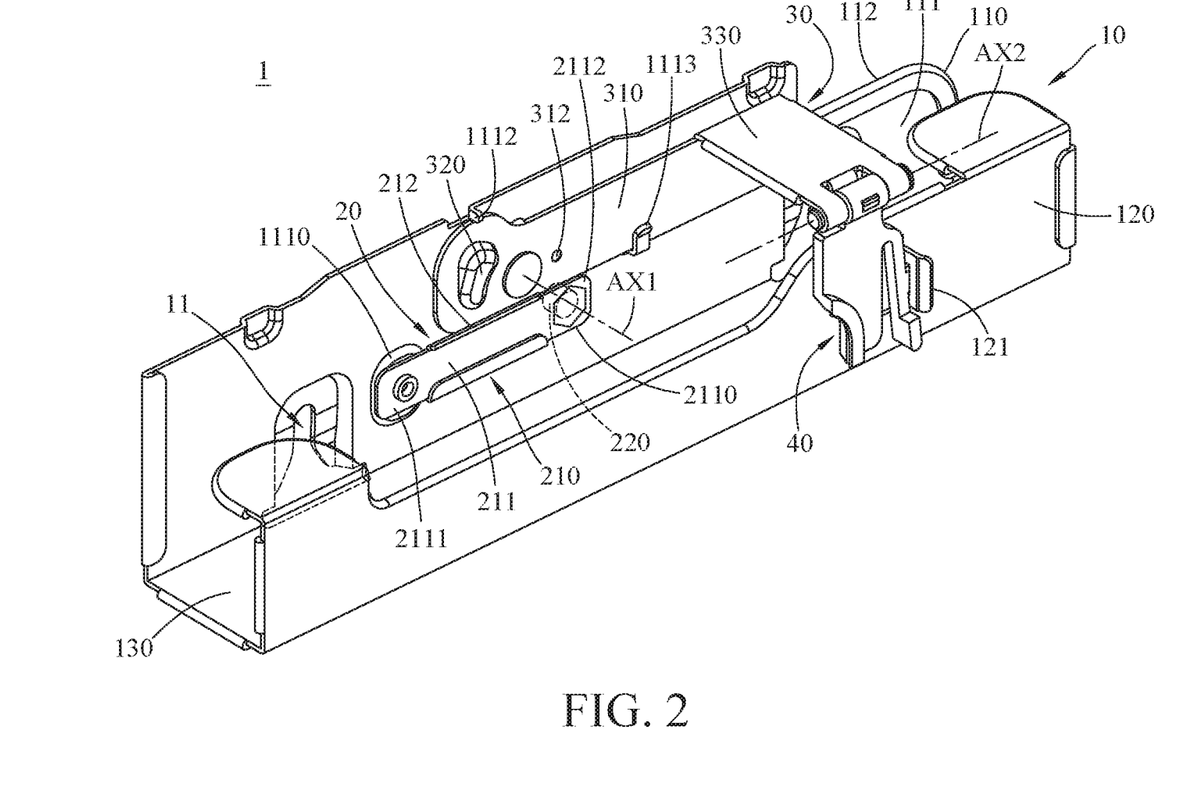
FIG. 2 is a perspective view of a cable management cage in FIG. 1.
Figure 3:
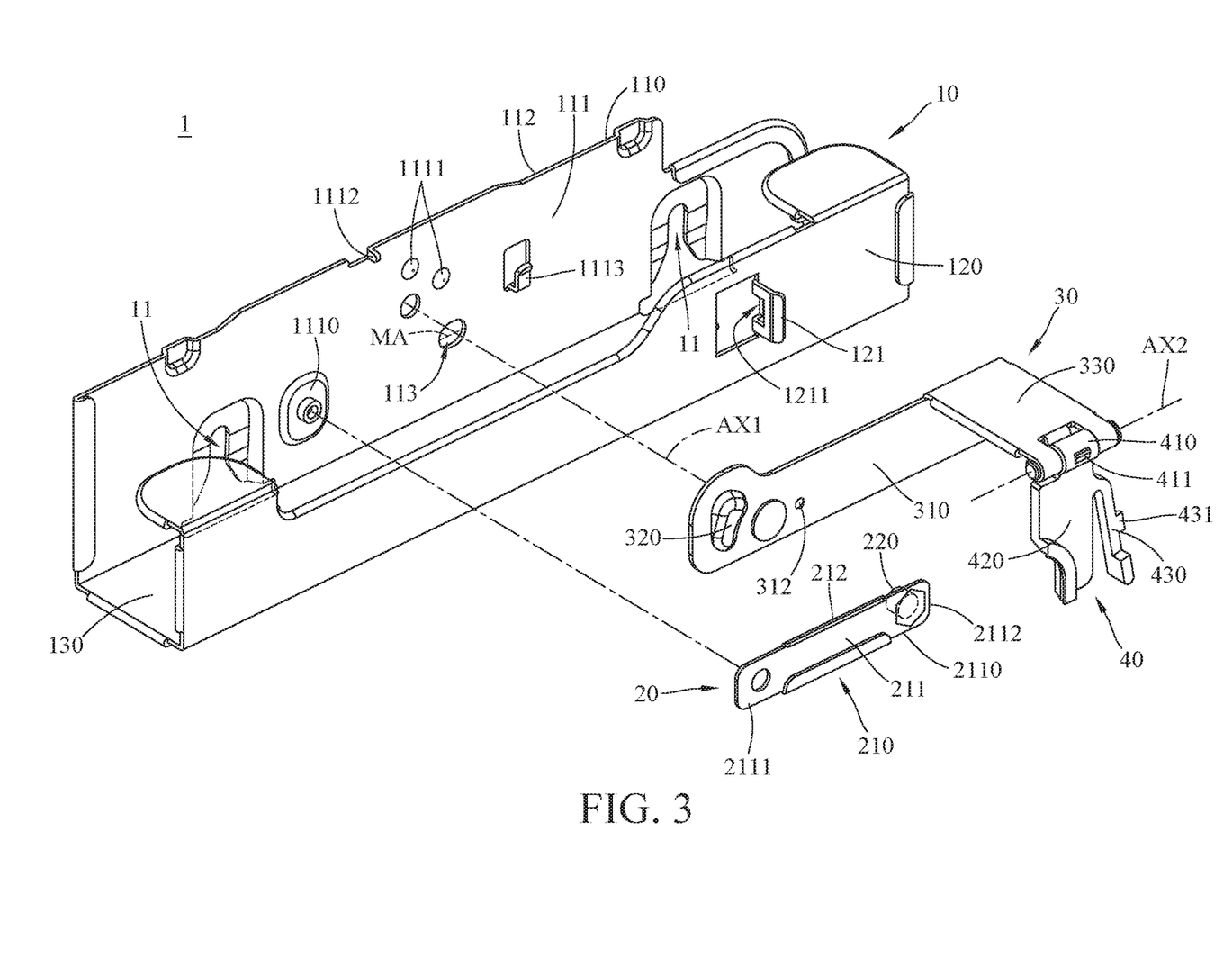
FIG. 3 is an exploded view of the cable management cage in FIG. 2.
Figure 4:
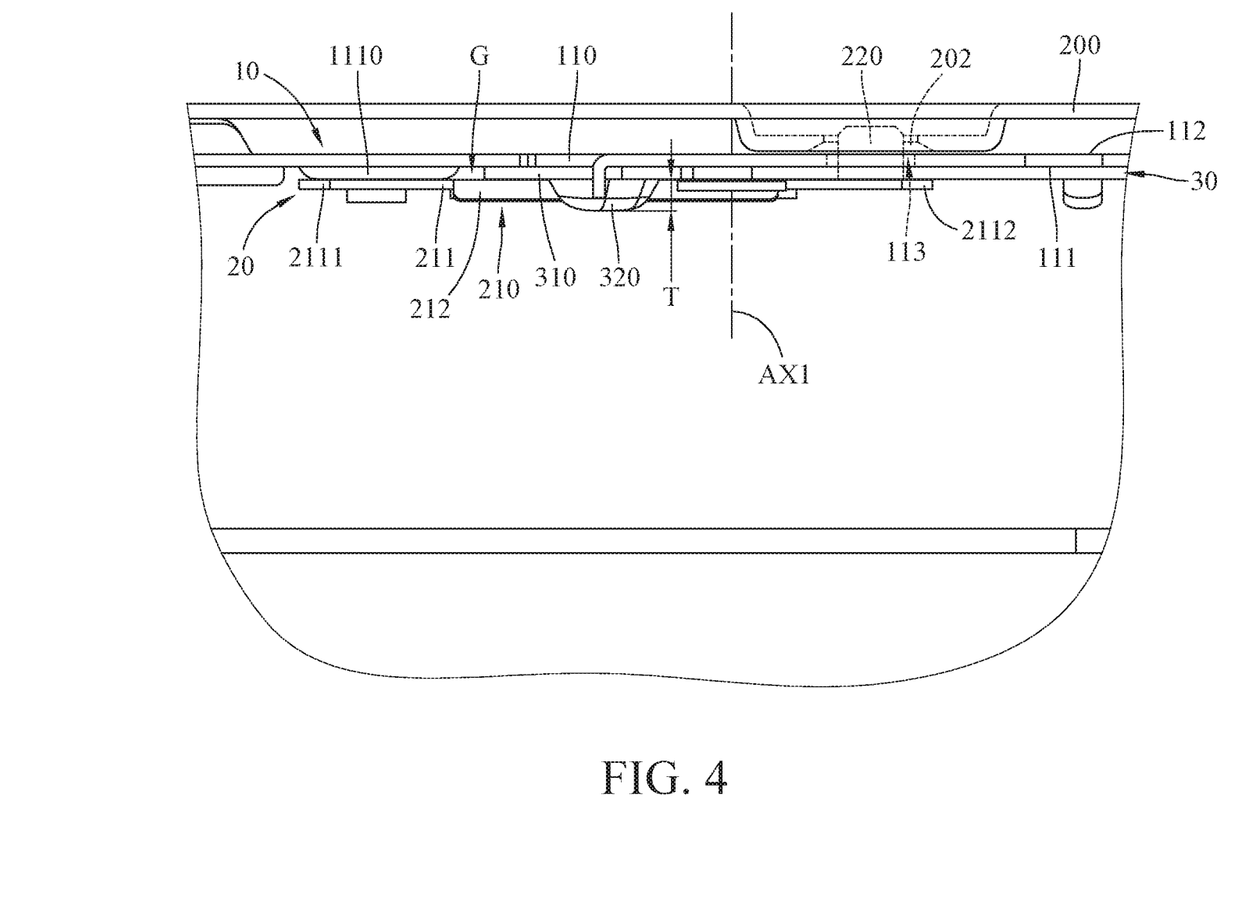
FIG. 4 is a partial enlarged top view of the cable management cage in FIG. 1.

Then, referring to FIG. 1 and further referring to FIGS. 2-4, the cable management cage 1 of this embodiment is introduced in more detail. In this embodiment, the cable management cage 1 includes the aforementioned cage body 10, an engagement component 20, a disengaging component 30, and a latch 40.

In detail, the cage body 10 may include a first sideboard 110, a second sideboard 120, and a bottom board 130, the first sideboard 110 and the second sideboard 120 are respectively connected to two opposite sides of the bottom board 130 so that the first sideboard 110, the second sideboard 120, and the bottom board 130 together form a U-shaped like structure configured for supporting the cable CB and allow the cable CB to be disposed therethrough.

Figure 10:
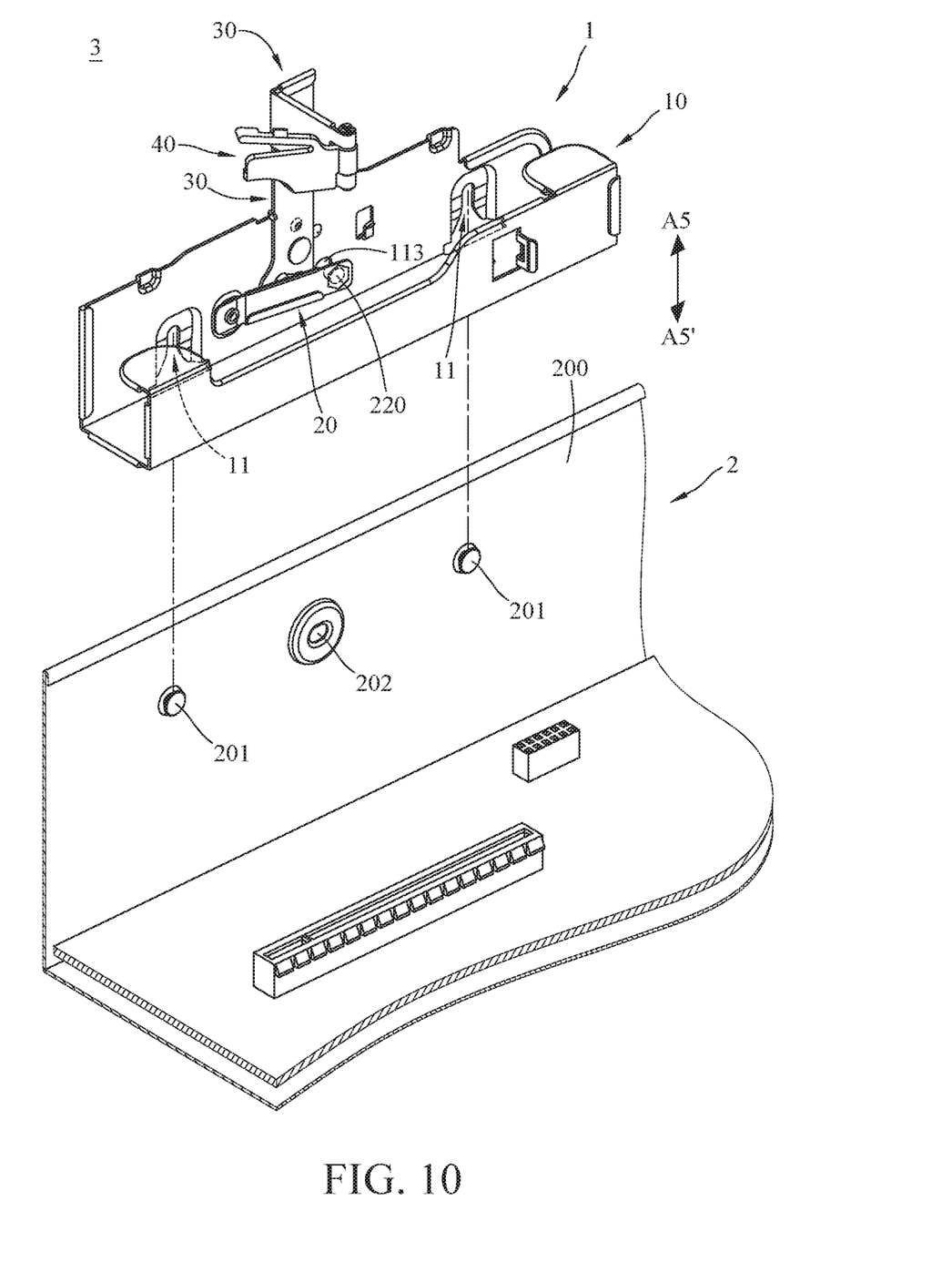
FIG. 10 illustrates the installation of the cable management cage to a chassis body of the chassis and the removal of the cable management cage from the chassis body of the chassis.

In more detail, the first sideboard 110 has an inner surface 111 and an outer surface 112 opposite to each other, the aforementioned mounting structure 11 is a through hole formed on the first sideboard 110 and penetrating through the inner surface 111 and the outer surface 112. In addition, the first sideboard 110 further has a through hole 113 penetrating through the inner surface 111 and the outer surface 112. As shown, the through hole 113 is, for example, an elongated hole or elliptical hole, which has a major axis MA. In this embodiment, when the cable management cage 1 is installed on the sidewall 200 of the chassis body 2, the through hole 113 may correspond to or be aligned with a mount hole 202 of the sidewall 200 (as shown in FIG. 4 or FIG. 10 mentioned the later paragraphs).

Further, in this embodiment, the first sideboard 110 may further have a convex structure 1110. The convex structure 1110 is, but not limited to, integrally protruding from the inner surface 111 of the first sideboard 110, and the convex structure 1110 may be located at an extension of the major axis MA of the aforementioned through hole 113.

The engagement component 20 is fixed on the convex structure 1110 of the first sideboard 110. In detail, in this embodiment, the engagement component 20 may include an elastic plate 210, the elastic plate 210 includes a plate-shaped body 211, one end of the plate-shaped body 211 is fixed to the convex structure 1110 of the first sideboard 110 via, for example, rivet, such that another end of the plate-shaped body 211 is suspended next to the inner surface 111 of the first sideboard 110. As shown in FIG. 4, the plate-shaped body 211 of the elastic plate 210 and the inner surface 111 of the first sideboard 110 of the cage body 10 are spaced apart by a gap G. It is understood that the gap G is substantially as wide as the thickness (not numbered) of the convex structure 1110. More specifically, in this embodiment, the plate-shaped body 211 has at least one long side 2110 substantially parallel to the major axis MA of the through hole 113 on the first sideboard 110 of the cage body 10, in other words, the elastic plate 210 substantially extends from the convex structure 1110 towards the through hole 113.

In such an arrangement, the elastic plate 210 and the first sideboard 110 of the cage body 10 are substantially arranged in a face-to-face manner. And the gap G between the elastic plate 210 and the first sideboard 110 is relatively small and is substantially neglectable to the space above the bottom board 130 of the cage body 10 so that it does not affect the placement or removal of the cable CB.

In addition, in this embodiment, the elastic plate 210 is made of, for example, metal, plastic, or other suitable elastic materials. Thus, a certain amount of force can deform the plate-shaped body 211 of the elastic plate 210 and cause it to curve. Herein, the plate-shaped body 211 has a fixed end 2111 and a free end 2112, the fixed end 2111 is an end of the plate-shaped body 211 being immovably fixed on the convex structure 1110, and the free end 2112 is another end of the plate-shaped body 211 opposite to the fixed end 2111 and movably close to or away from the inner surface 111 of the first sideboard 110 while experiencing external force.

Furthermore, in this embodiment, the engagement component 20 may further include an engaging structure 220 fixed on the free end 2112 of the plate-shaped body 211 via, for example, rivet or adhesive. As shown, the engaging structure protrudes from the free end 2112 towards the inner surface 111 of the first sideboard 110. The engaging structure 220 is moveable along with the free end 2112, such that the engaging structure 220 is movable with respect to the inner surface 111 of the first sideboard 110. In some embodiments, the engaging structure may be a protrusion integrally formed on the free end of the plate-shaped body.

As shown in FIG. 4, when the plate-shaped body 211 of the elastic plate 210 is not deformed yet, the engaging structure 220 at the free end 2112 is disposed through the through hole 113 on the first sideboard 110 of the cage body 10, protrudes from the outer surface 112 of the first sideboard 110, and removably engaged with the mount hole 202 on the sidewall 200 corresponding the through hole 113. When the free end 2112 is moved away from the inner surface 111 of the first sideboard 110, the free end 2112 can bring the engaging structure 220 to sink into the through hole 113 of the first sideboard 110, specifically, the free end 2112 can move the engaging structure 220 to a position not protruding from the outer surface 112 of the first sideboard 110 and thus removing the engaging structure 220 from the mount hole 202 of the sidewall 200.

As discussed, the engaging structure 220 at the free end 2112 is moved by the deformation of the elastic plate 210, thus the moving path of the engaging structure 220 is substantially a curved line as that of the free end 2112, where the shape of the through hole 113 on the first sideboard 110 (elongated hole or elliptical hole) can prevent the through hole 113 from interfering with the engaging structure 220 during the movement of the engaging structure 220.

Figure 7:
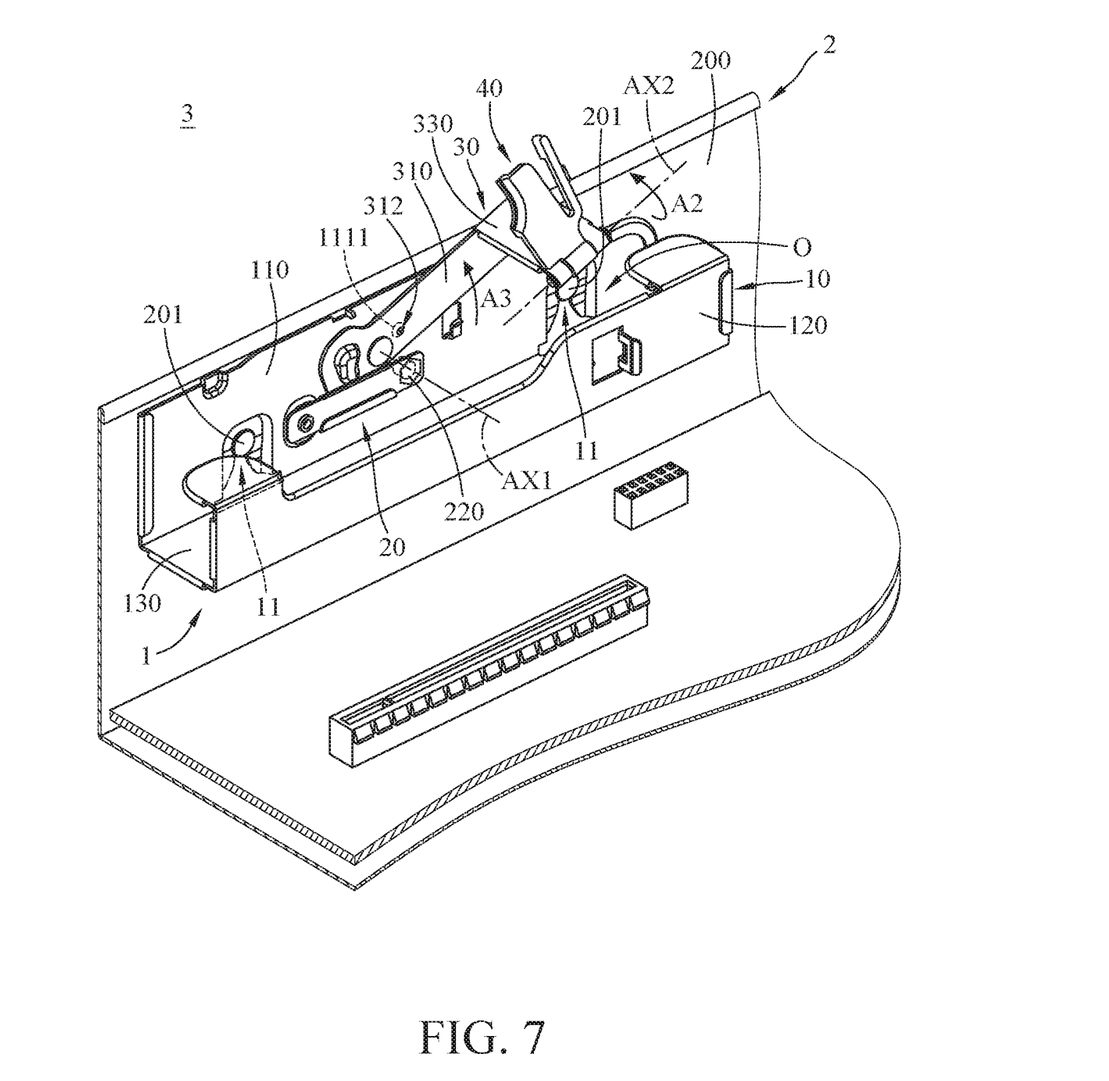
FIGS. 7-8 illustrate the operation of the cable management cage in FIG. 1.
Figure 8:
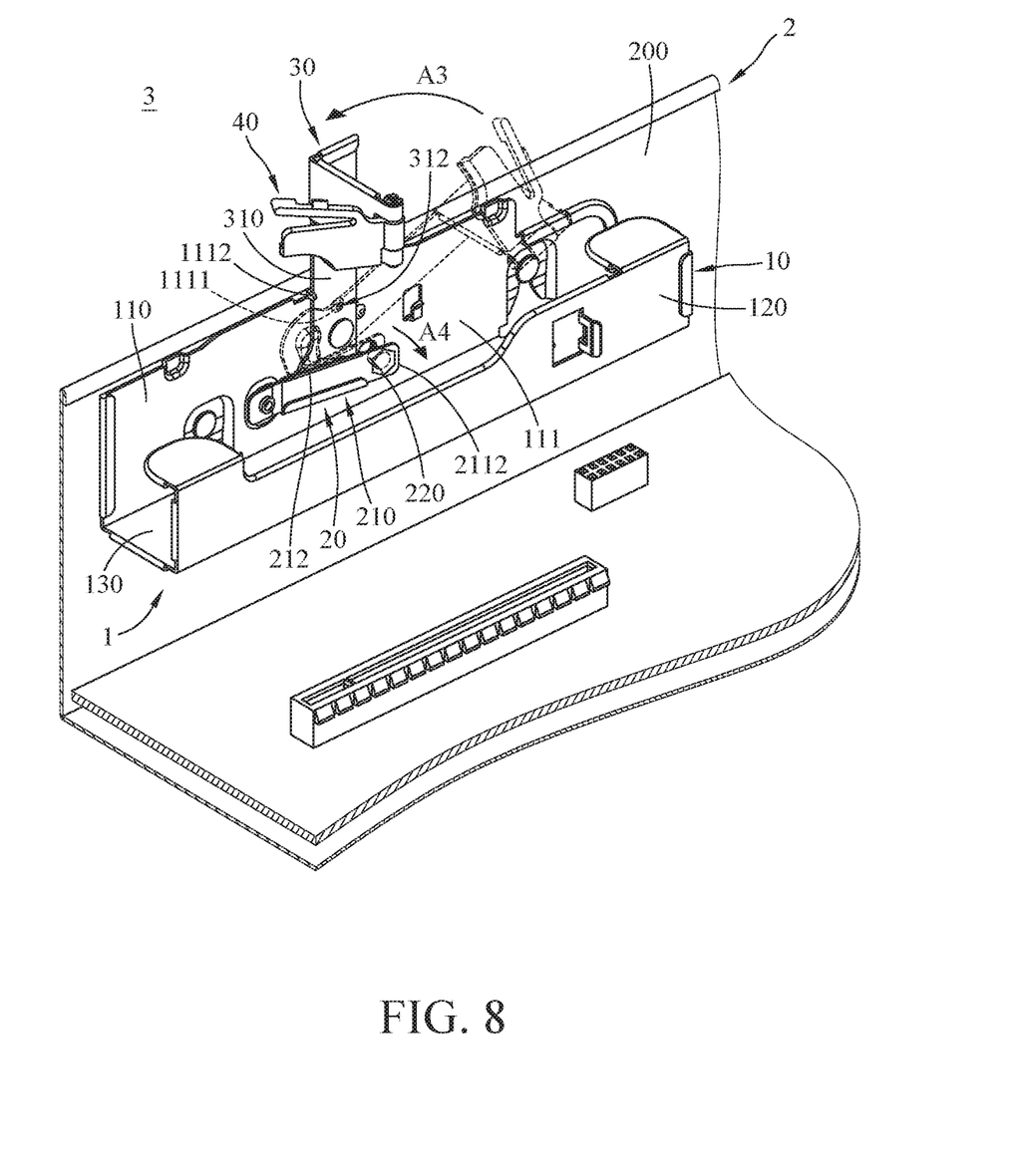

Further, in this embodiment, the elastic plate 210 may further include a guiding structure 212, the guiding structure 212 is integrally formed at a side of the plate-shaped body 211 and extends outwards from the plate-shaped body 211 and thus at an angle to the plate-shaped body 211. The guiding structure 212 is configured to guide part of the disengaging component 30 into the aforementioned gap G. In detail, in this embodiment, the disengaging component 30 is movably disposed on the first sideboard 110 of the cage body 10 and movable between a disengaging status (as shown in FIG. 8 mentioned in the later paragraphs) and a non-disengaging status (as shown in FIG. 2 or FIG. 7 mentioned in the later paragraphs). Specifically, the disengaging component 30 may include a plate portion 310 and a convex structure 320, the plate portion 310 is pivotally disposed on the inner surface 111 of the first sideboard 110 of the cage body 10 via, for example, rivet or other suitable manners. Herein, the plate portion 310 is pivotable about an axis AX1 with respect to the first sideboard 110. The thickness of the plate portion 310 may be substantially equal to or slightly smaller than the gap G between the elastic plate 210 and the inner surface 111 of the cage body 10, in other words, the thickness of the plate portion 310 may be substantially equal to or slightly smaller than the thickness (not numbered) of the aforementioned convex structure 1110.

The convex structure 320 is integrally formed on a surface of the plate portion 310 facing away from the inner surface 111 of the first sideboard 110 and protrudes outwards from the surface of the plate portion 310. The convex structure 320 can be moved with the plate portion 310 and therefore can be pivoted about the axis AX1 with respect to the first sideboard 110. In some other embodiments, the convex structure 320 may be an independent piece additionally mounted on the plate portion 310. In FIG. 4, the convex structure 320 protrudes from the plate portion 310 and therefore has a thickness T to the surface of the plate portion 310, where the thickness T is larger than the gap G between the elastic plate 210 and the inner surface 111 of the cage body 10. In such an arrangement, when the plate portion 310 brings the convex structure 320 to move towards the elastic plate 210, the guiding structure 212 of the elastic plate 210 can contact and guide the convex structure 320 to move into the gap G.

In addition, in order to position the disengaging component 30 at desired positions during the movement between the disengaging status and the non-disengaging status, the first sideboard 110 of the cage body 10 and the plate portion 310 of the disengaging component 30 may have matching structures. As shown, in this embodiment, the first sideboard 110 further has at least one first positioning structure 1111, a stopping structure 1112, and a stopping structure 1113, and the plate portion 310 may have a second positioning structure 312.

There are two first positioning structures 1111 on the first sideboard 110. The first positioning structures 1111 may be convex structures integrally formed on the inner surface 111 of the first sideboard 110, and the second positioning structure 312 may be a recess or through hole matching the first positioning structures 1111. That is, the first positioning structures 1111 and the second positioning structure 312 are mutually fitting concave-convex arrangement. In more detail, the first positioning structures 1111 may be arranged along an arc line (not shown) centered on the axis AX1, thus, the second positioning structure 312 is allowed to be engaged with the corresponding first positioning structure 1111 while the plate portion 310 is pivoted with respect to the first sideboard 110. On the other hand, the stopping structure 1112 and the stopping structure 1113 both protrude from the inner surface 111 of the cage body 10 and are respectively configured to stop the disengaging component 30 at the disengaging status (as shown in FIG. 8 mentioned the later paragraphs) and the non-disengaging status (as shown in FIG. 2 or FIG. 7 mentioned the later paragraphs), and thereby limit the movable range of the disengaging component 30 on the first sideboard 110.

Please refer back to FIGS. 2-3, in this embodiment, the disengaging component 30 may further include a bridge portion 330, the plate portion 310 of the disengaging component 30 is connected to the latch 40 via the bridge portion 330, and the plate 310, therefore, can be fixed to the second sideboard 120 via the latch 40. In detail, the bridge portion 330 is integrally formed from one side of the plate portion 310 and extends outwards from the plate portion 310, when the disengaging component 30 is in the non-disengaging status (as shown in FIG. 2), the bridge portion 330 extends from the plate portion 310 to the top side of the second sideboard 120 and is located above the bottom board 130. The latch 40 is pivotally connected to the bridge portion 330 and is detachably fixed to the second sideboard 120, thus, the disengaging component 30 can be fixed to the second sideboard 120 and maintained at the non-disengaging status by the latch 40.

In more detail, in this embodiment, the latch 40 may include a shaft 410, a main body 420 and an elastic latch arm 430, and the second sideboard 120 may have a bent tab 121. The shaft 410, the main body 420, and the elastic latch arm 430 of the latch 40 may be integrally formed into a single piece, and may be made of, for example, metal, plastic, or other suitable elastic materials. The main body 420 is pivotally connected to an end of the bridge portion 330 opposite to the plate portion 310 via the shaft 410. In this embodiment, the shaft 410 of the latch 40 is pivotally connected to the bridge portion 330 of the disengaging component 30 via, for example, a pin or other suitable means, but the disclosure is not limited thereto. Herein, the shaft 410 has an axis AX2, and the main body 420 is pivotable about the axis AX2 with respect to the bridge portion 330.

One end of the elastic latch arm 430 is connected to the main body 420, another end of the elastic latch arm 430 is suspended next to the main body 420, such that the elastic latch arm 430 is at an angle to the main body 420 while no external force is applied. And a certain amount of force can deform the elastic latch arm 430 and therefore change the angle between the elastic latch arm 430 and the main body 420.

Figure 5:
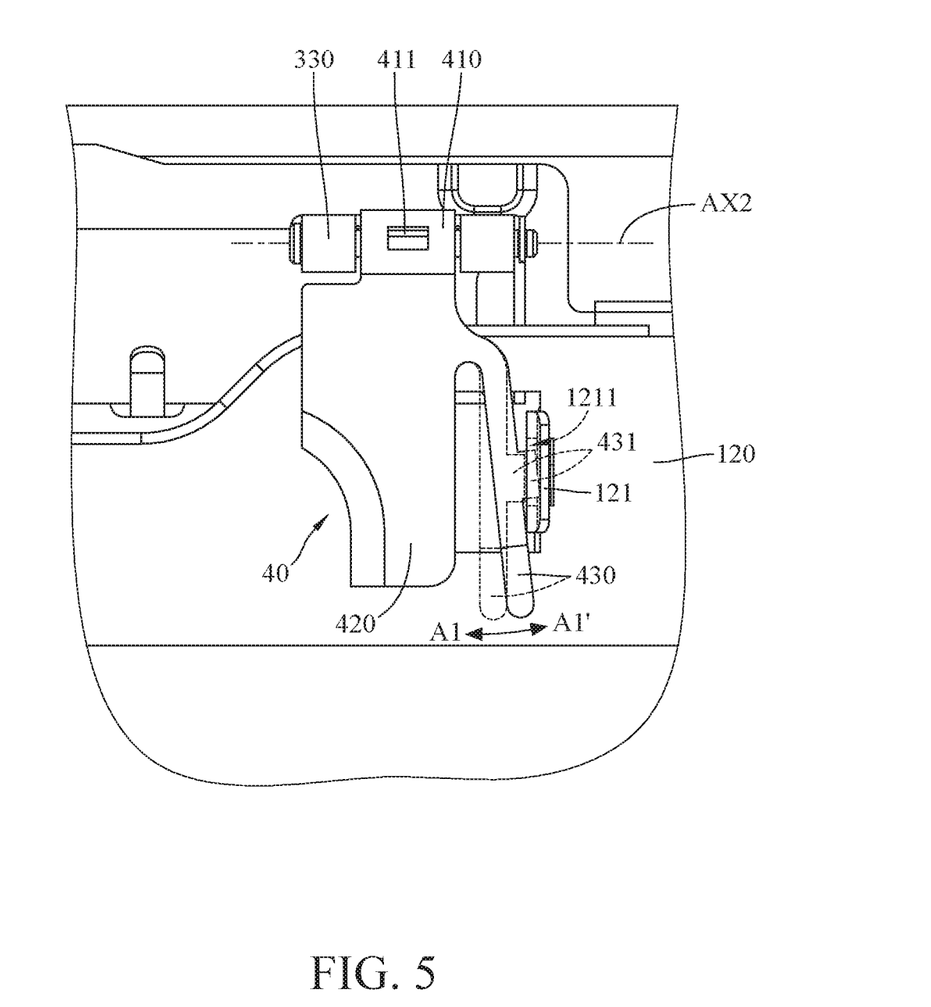
FIG. 5 is a partial enlarged side view of the cable management cage in FIG. 1.

In this embodiment, the bent tab 121 protrudes from the surface of the second sideboard 120 facing away from the first sideboard 110. In this embodiment, the elastic latch arm 430 may have a latching structure 431, the bent tab 121 may have a latching structure 1211, where one of the latching structure 431 and the latching structure 1211 is a protrusion, and the other is a recess or through hole matching the protrusion. That is, the latching structure 431 and the latching structure 1211 are mutually fitting concave-convex arrangement. In FIG. 5, when the disengaging component 30 is in the non-disengaging status, pivoting the latch 40 to a proper position can allow the elastic latch arm 430 to be detachably engaged with the bent tab 121 of the second sideboard 120. Specifically, as shown in FIG. 5, an external force may cause the elastic latch arm 430 to move in the direction indicated by an arrow A1 so as to detach the latching structure 431 from the latching structure 1211; and the elastic latch arm 430 can restore to its original state in the direction indicated by an arrow A1' to engage the latching structure 431 with the latching structure 1211 when the force is canceled.

Figure 6:
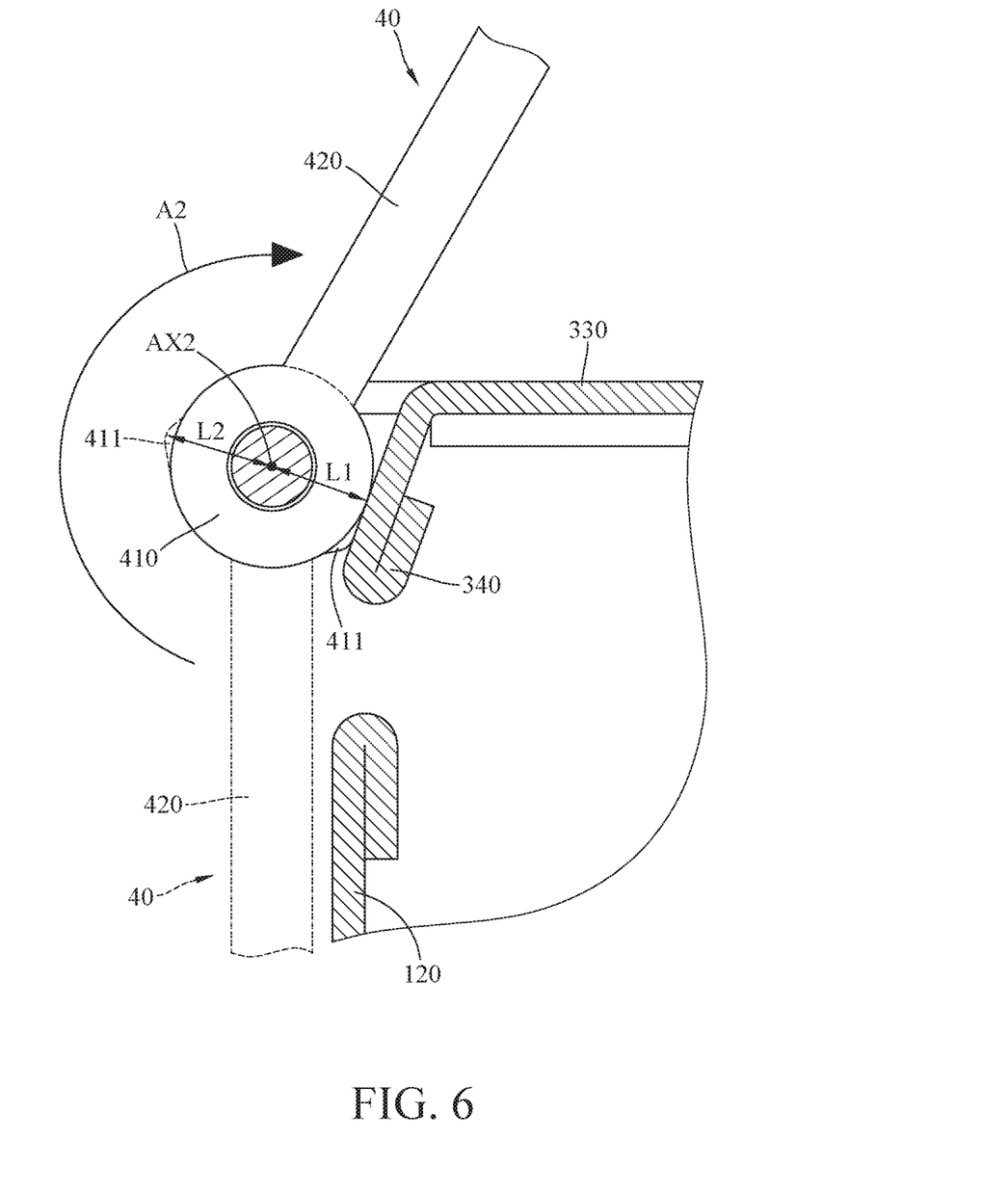
FIG. 6 illustrates the movement of a latch of the cable management cage in FIG. 1.

Please refer to FIGS. 2-3 and further refer to FIG. 6, in this embodiment, the disengaging component 30 may further include a tongue portion 340, and the shaft 410 of the latch 40 may have a protrusion 411. The tongue portion 340 extends outwards from the end of the bridge portion 330 opposite to the plate portion 310, the tongue portion 340 is at an angle to the bridge portion 330 and is located at a side of the shaft 410 of the latch 40, and the protrusion 411 protrudes from the surface of the shaft 410. As shown in FIG. 6, a distance L1 between the axis AX2 of the shaft 410 of the latch 40 and the tongue portion 340 is smaller than a distance L2 between the axis AX2 and the outermost surface of the protrusion 411 on the shaft 410. In such an arrangement, during the pivotal movement of the latch 40 in an arrow A2 to the position illustrated in solid line, the protrusion 411 on the shaft 410 of the latch 40 can push and slide over the tongue portion 340 and cause it to deform. As the latch 40 reaches the position in solid line, the protrusion 411 can press against the tongue portion 340 so as to secure the current position of the shaft 410 of the latch 40. Note that the shape and size of the protrusion 411 are not particularly restricted as long as it can maintain the shaft 410 of the latch 40 at the position shown in solid line in FIG. 6 and at least not make the shaft 410 too difficult to pivot or leave the current position.

Then, please refer to FIGS. 7-10, the operation of the cable management cage 1 is illustrated in detail. For the purpose of simple and clear illustration, FIGS. 7-10 omit the aforementioned cable CB. Firstly, the engagement between the elastic latch arm 430 of the latch 40 and the bent tab 121 of the second sideboard 120 can be released, such that the disengaging component 30 is allowed to be pivoted towards the disengaging status. Then or meanwhile, as shown in FIG. 7, the latch 40 is pivoted in the direction indicated by the arrow A2 and is fixed in the position shown in solid line in FIG. 6. Then or meanwhile, the disengaging component 30 is pivoted in the direction indicated by the arrow A3 to engage the second positioning structure 312 of the plate portion 310 with one of the first positioning structures 1111 of the first sideboard 110 located closer to the bottom board 130. At this moment, the disengaging component 30 is still in the non-disengaging status, the engaging structure 220 of the engagement component 20 is still engaged with the mount hole 202 of the sidewall 200 of the chassis body 2, and the bridge portion 330 of the disengaging component 30, the latch 40, and the second sideboard 120 from an opening O therebetween. The cable CB can be placed into the cage body 10 of the cable management cage 1 or taken out of the cage body 10 via the opening O. During the placement or removal of the cable CB, the engaging structure 220 remain engage with the mount hole 202 of the sidewall 200, thus the cable management cage 1 is stably in the current position without loosening.

Figure 9:
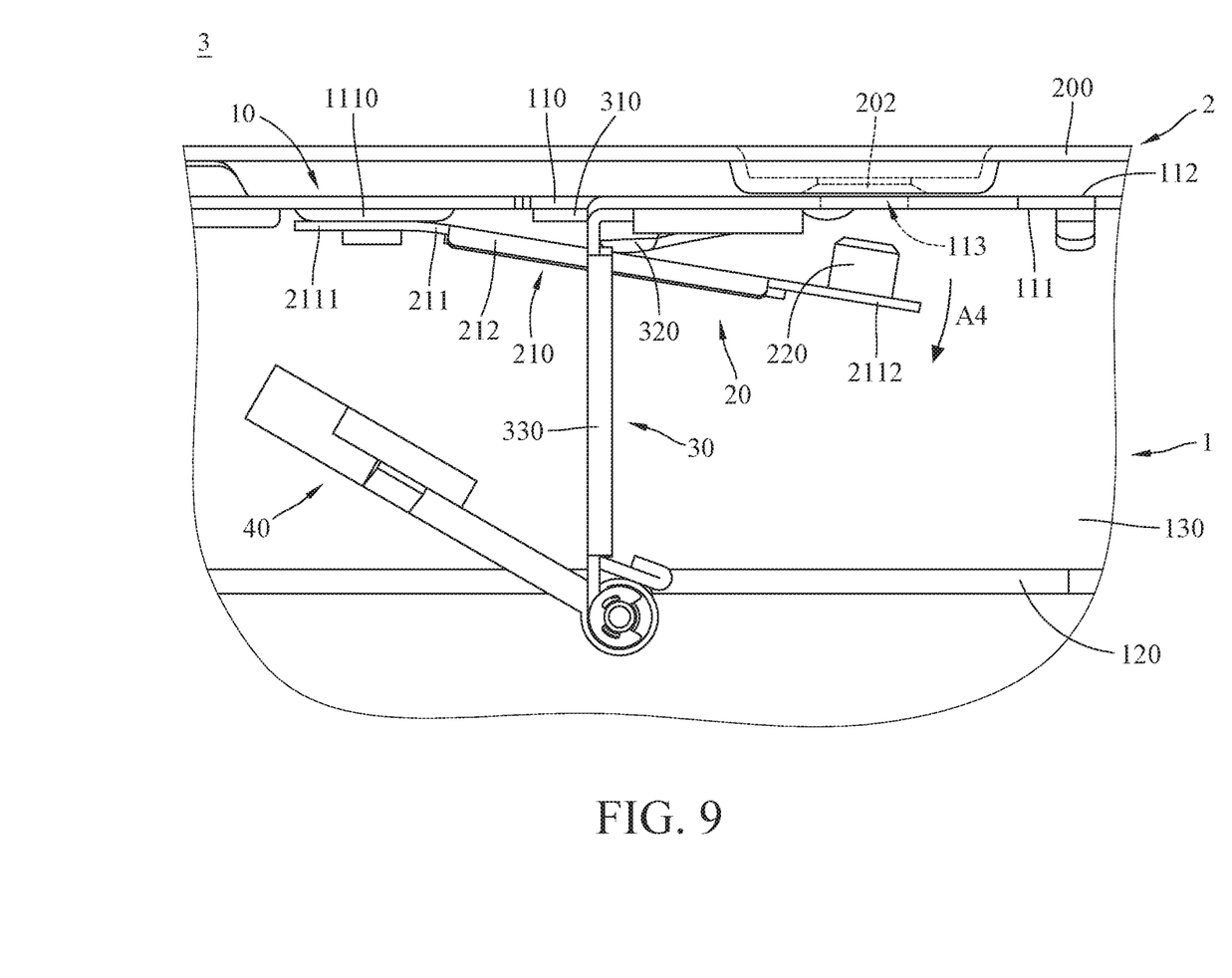
FIG. 9 is a partial enlarged top view of the cable management cage in FIG. 7.

Then, in FIGS. 8-9, the disengaging component 30 is then forced to further pivot in the direction indicated by the arrow A3 to engage the second positioning structure 312 of the plate portion 310 with another first positioning structure 1111 relative away from the bottom board 130. As the disengaging component 30 reaches the position shown in FIG. 8, the plate portion 310 of the disengaging component 30 will be stopped by the stopping structure 1112. At this moment, the disengaging component 30 is switched to the disengaging status, the plate portion 310 can be maintained at the current position by the cooperation of the second positioning structure 312 and the first positioning structure 1111. And during such movement of the disengaging component 30, the convex structure 320 of the disengaging component 30 will be guided by the guiding structure 212 of the elastic plate 210 and enter into the gap G between the elastic plate 210 and the first sideboard 110. As discussed, the thickness of the convex structure 320 is greater than the gap G, thus the entrance of the convex structure 320 into the gap G will cause the elastic plate 210 to deform, such that the free end 2112 of the elastic plate 210 is forced to move away from the inner surface 111 of the first sideboard 110 (as the arrow A4 shown in FIG. 9). This can move the engaging structure 220 on the free end 2112 to a position to a position sinking into the through hole 113 of the first sideboard 110 and not protruding from the outer surface 112 of the first sideboard 110. As such, the engaging structure 220 is disengaged from the mount hole 202 of the sidewall 200, such that the cable management cage 1 is held on the sidewall 200 of the chassis body 2 only by the mounting structure 11 and mounting structure 201.

Then, as shown in FIG. 10, the cable management cage 1 is allowed to be moved along the mounting structure 11 with respect to the sidewall 200 of the chassis body 2 along in the direction indicated by the arrow A5 or arrow A5', that is, the cable management cage 1 now can be removed from the sidewall 200 or installed onto the sidewall 200 and thus achieving easy and fast installation, removal, and operation of the cable management cage 1.

The above cable management cage is an exemplary embodiment of the disclosure and is not intended to limit the disclosure. In some other embodiments, the cable management cage may omit the aforementioned latch, and the disengaging component may only have the plate portion and the convex structure thereon; in such a case, the positioning arrangement on the cable management cage to prevent loosening can be substantially two sheet structures arranged along the inner surface of the cage body.

According to the cable management cage and the chassis as discussed in the above embodiments, the engaging arrangement for fixing the cable management cage in position is implemented by the elastic plate of the engagement component and the engaging structure located on the free end of the elastic plate, where the elastic plate is in plate shape and the engaging structure is configured to be disposed through the through hole of the cage body, thus such an engaging arrangement only occupies a very small space above the cage body. On the other hand, the disengaging arrangement for releasing the cable management cage is implemented by the entrance of the disengaging component into the gap between the elastic plate and the inner surface of the cage body and does not interfere with the placement or removal of the cable from the cage body, thus the human hand or cable is prevented from accidentally releasing the cable management cage during the placement or removal of the cable. As such, the cable management cage and chassis discussed in the aforementioned embodiments of the disclosure can minimize the space occupied by the engaging arrangement and prevent unexpected loosening.

In addition, in some embodiments, the cable management cage further include a latch detachably fixed on the cage body to maintain the disengaging component at the non-disengaging status.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A cable management cage, comprising:
   a cage body, having an inner surface, an outer surface opposite to the inner surface, and a through hole penetrating through the inner surface and the outer surface;
   an engagement component, comprising an elastic plate and an engaging structure, the elastic plate comprising a fixed end and a free end opposite to each other, wherein the fixed end of the elastic plate is fixed to the inner surface of the cage body, the elastic plate and the inner surface are spaced apart by a gap, and the engaging structure is fixed on the free end of the elastic plate and movably disposed through the through hole; and
   a disengaging component, rotatably disposed on the cage body and having a disengaging status and a non-disengaging status;
   wherein when the disengaging component is in the non-disengaging status, the engaging structure protrudes from the outer surface of the cage body; when the disengaging component is in the disengaging status, at least part of the disengaging component enters into the gap to cause the free end of the elastic plate to move away from the through hole so as to move the engaging structure to a position not protruding from the outer surface of the cage body.

2. The cable management cage according to claim 1, wherein the elastic plate comprises a plate-shaped body and a guiding structure, the plate-shaped body and the inner surface of the cage body are spaced apart by the gap, the guiding structure protrudes outwards from a side of the plate-shaped body and is at an angle to the plate-shaped body, and the guiding structure is configured to contact and guide the disengaging component.

3. The cable management cage according to claim 1, wherein the disengaging component comprises a plate portion and a convex structure, the plate portion is pivotally disposed on the inner surface of the cage body, the convex structure protrudes outwards from the plate portion, a thickness of the convex structure is greater than the gap between the elastic plate and the cage body; when the disengaging component is in the disengaging status, the convex structure enters into the gap and cause the elastic plate to deform.

4. The cable management cage according to claim 3, wherein the disengaging component further comprises a bridge portion extends from a side of the plate portion, the cage body comprises a first sideboard, a second sideboard, and a bottom board, the bottom board is connected to and located between the first sideboard and the second sideboard, the first sideboard has the inner surface and the outer surface, the engagement component and the plate portion of the disengaging component are both disposed on the first sideboard, the bridge portion of the disengaging component is detachably fixed to the second sideboard.

5. The cable management cage according to claim 4, further comprising a latch, movably disposed on the bridge portion of the disengaging component, the bridge portion is detachably fixed to the second sideboard via the latch.

6. The cable management cage according to claim 5, wherein the latch has a shaft, the shaft is pivotally disposed on the bridge portion of the disengaging component, the shaft has a protrusion, the disengaging component further comprises a tongue portion, the tongue portion protrudes outwards from an end of the bridge portion and is located at a side of the shaft, a distance between an axis of the shaft and the tongue portion is smaller than a distance between the axis of the shaft and a surface of the protrusion.

7. The cable management cage according to claim 1, wherein the through hole of the cage body is an elongated hole, a major axis of the elongated hole is substantially parallel to a long side of the elastic plate of the engagement component.

8. The cable management cage according to claim 3, wherein the cage body has at least two first positioning structures, the at least two first positioning structures protrude from the inner surface of the cage body, the plate portion of the disengaging component has an axis and at least one second positioning structure, the axis is located between the convex structure and the at least one second positioning structure, the at least two first positioning structures and the at least one second positioning structure are mutually fitting concave-convex arrangement; when the at least one second positioning structure is engaged with one of the at least two first positioning structures relatively away from the elastic plate, the disengaging component is maintained at the disengaging status; when the at least one second positioning structure is engaged with one of the at least two first positioning structures relatively closer to the elastic plate, the disengaging component is maintained at the non-disengaging status.

9. The cable management cage according to claim 1, wherein the cage body has at least one stopping structure, the at least one stopping structure protrudes from the inner surface of the cage body and is configured to limit a movable range of the disengaging component.

10. A chassis, comprising:
a chassis body, comprising at least one sidewall, wherein the at least one sidewall has a mount hole;
a cage body, having an inner surface, an outer surface opposite to the inner surface, and a through hole penetrating through the inner surface and the outer surface;
an engagement component, comprising an elastic plate and an engaging structure, the elastic plate comprising a fixed end and a free end opposite to each other, wherein the fixed end of the elastic plate is fixed to the inner surface of the cage body, the elastic plate and the inner surface are spaced apart by a gap, and the engaging structure is fixed on the free end of the elastic plate and movably disposed through the through hole; and
a disengaging component, rotatably disposed on the cage body and having a disengaging status and a non-disengaging status;
wherein the cage body is detachably disposed on the at least one sidewall, the through hole of the cage body corresponds to the mount hole; when the disengaging component is in the non-disengaging status, the engaging structure protrudes from the outer surface of the cage body and located in the mount hole; when the disengaging component is in the disengaging status, the engaging structure does not protrude from the outer surface of the cage body and is detached from the mount hole.

11. The chassis according to claim 10, wherein the elastic plate comprises a plate-shaped body and a guiding structure, the plate-shaped body and the inner surface of the cage body are spaced apart by the gap, the guiding structure protrudes from a side of the plate-shaped body and is at an angle to the plate-shaped body, and the guiding structure is configured to contact and guide the disengaging component.

12. The chassis according to claim 10, wherein the disengaging component comprises a plate portion and a convex structure, the plate portion is pivotally disposed on the inner surface of the cage body, the convex structure protrudes outwards from the plate portion, a thickness of the convex structure is greater than the gap between the elastic plate and the cage body; when the disengaging component is in the disengaging status, the convex structure enters into the gap and cause the elastic plate to deform.

13. The chassis according to claim 12, wherein the disengaging component further comprises a bridge portion extends from a side of the plate portion, the cage body comprises a first sideboard, a second sideboard, and a bottom board, the bottom board is connected to and located between the first sideboard and the second sideboard, the first sideboard has the inner surface and the outer surface, the engagement component and the plate portion of the disengaging component are both disposed on the first sideboard, the bridge portion of the disengaging component is detachably fixed to the second sideboard.

14. The chassis according to claim 13, further comprising a latch movably disposed on the bridge portion of the disengaging component, wherein the bridge portion is detachably fixed to the second sideboard via the latch.

15. The chassis according to claim 14, wherein the latch has a shaft, the shaft is pivotally disposed on the bridge portion of the disengaging component, the shaft has a protrusion, the disengaging component further comprises a tongue portion, the tongue portion protrudes outwards from an end of the bridge portion and is located at a side of the shaft, a distance between an axis of the shaft and the tongue portion is smaller than a distance between the axis of the shaft and a surface of the protrusion.

16. The chassis according to claim 10, wherein the through hole of the cage body is an elongated hole, a major axis of the elongated hole is substantially parallel to a long side of the elastic plate of the engagement component.

17. The chassis according to claim 12, wherein the cage body has at least two first positioning structures, the at least two first positioning structures protrude from the inner surface of the cage body, the plate portion of the disengaging component has an axis and at least one second positioning structure, the axis is located between the convex structure and the at least one second positioning structure, the at least two first positioning structures and the at least one second positioning structure are mutually fitting concave-convex arrangement; when the at least one second positioning structure is engaged with one of the at least two first positioning structures relatively away from the elastic plate, the disengaging component is maintained at the disengaging status; when the at least one second positioning structure is engaged with one of the at least two first positioning structures relatively closer to the elastic plate, the disengaging component is maintained at the non-disengaging status.

18. The chassis according to claim 10, wherein the cage body has at least one stopping structure, the at least one stopping structure protrudes from the inner surface of the cage body and is configured to limit a movable range of the disengaging component.

* * * * *